(12) United States Patent
Barr et al.

(10) Patent No.: US 9,663,715 B2
(45) Date of Patent: May 30, 2017

(54) POLYCRYSTALLINE TEXTURING COMPOSITION AND METHOD

(75) Inventors: Robert K. Barr, Shrewsbury, MA (US); Corey O'Connor, Worcester, MA (US)

(73) Assignee: Sun Chemical Corporation, Parsippany, NJ (US)

( * ) Notice: Subject to any disclaimer, the term of this patent is extended or adjusted under 35 U.S.C. 154(b) by 0 days.

(21) Appl. No.: 13/453,753

(22) Filed: Apr. 23, 2012

(65) Prior Publication Data

US 2012/0267627 A1    Oct. 25, 2012

Related U.S. Application Data

(60) Provisional application No. 61/477,933, filed on Apr. 21, 2011.

(51) Int. Cl.
```
C09K 13/00      (2006.01)
C09K 13/08      (2006.01)
H01L 31/0236    (2006.01)
```

(52) U.S. Cl.
CPC .......... *C09K 13/08* (2013.01); *H01L 31/0236* (2013.01)

(58) Field of Classification Search
USPC ............... 252/79.1, 79.3, 79.4; 510/175, 176
See application file for complete search history.

(56) References Cited

U.S. PATENT DOCUMENTS

| | | |
|---|---|---|
| 4,113,551 A | 9/1978 | Bassous et al. |
| 4,171,242 A | 10/1979 | Liu |
| 6,589,884 B1 | 7/2003 | Torek |
| 7,166,539 B2 | 1/2007 | Fuesko et al. |
| 7,192,860 B2 | 3/2007 | McFarland et al. |
| 7,250,114 B2 * | 7/2007 | Kiehlbauch et al. ........... 216/31 |
| 7,977,249 B1 | 7/2011 | Liu et al. |
| 2003/0036569 A1 | 2/2003 | Lamanna et al. |
| 2004/0224866 A1 * | 11/2004 | Matsunaga et al. .......... 510/175 |
| 2005/0247674 A1 | 11/2005 | Kuelbech et al. |
| 2006/0000492 A1 * | 1/2006 | Carter ............................. 134/26 |
| 2009/0082240 A1 | 3/2009 | Nukui et al. |
| 2009/0093107 A1 | 4/2009 | Lee et al. |
| 2010/0065530 A1 | 3/2010 | Walker et al. |
| 2010/0197144 A1 * | 8/2010 | Dove et al. ................... 438/753 |
| 2011/0081742 A1 * | 4/2011 | Barr et al. ...................... 438/71 |

FOREIGN PATENT DOCUMENTS

| | | |
|---|---|---|
| EP | 1077241 A2 | 2/2001 |
| JP | 2000-349065 A | 12/2000 |
| JP | 2005-537680 A | 12/2005 |

(Continued)

OTHER PUBLICATIONS

Singapore Search Report of corresponding Singapore Application No. 201202940-1.

(Continued)

*Primary Examiner* — Shamim Ahmed

(74) *Attorney, Agent, or Firm* — Frost Brown Todd LLC

(57) ABSTRACT

An aqueous acidic composition which includes alkaline compounds, fluoride ions and oxidizing agents is provided for texturing polycrystalline semiconductors. Methods for texturing are also disclosed. The textured polycrystalline semiconductors have reduced reflectance of light incidence.

9 Claims, 3 Drawing Sheets

(56) References Cited

FOREIGN PATENT DOCUMENTS

| JP | 2008-191624 | 8/2008 |
| JP | 2009-231354 | 10/2009 |
| JP | 2004-533511 A | 11/2011 |
| KR | 10-2008-0029412 | 4/2008 |
| KR | 10-2009-0007065 | 1/2009 |
| WO | 2002092211 | 11/2002 |
| WO | 2007111694 A2 | 10/2007 |
| WO | 2010081661 | 7/2010 |

OTHER PUBLICATIONS

Basu, et al, "A cost effective alkaline multicrystalline silicon surface polishing solution with improves smoothness," Solar Energy materials & Solar Cells, 2009, pp. 1743-1748, vol. 93.

Gangopadhyay, et al, "Novel low cost chemical texturing for very large area industrial multi-crystalline silicon solar cells", Semiconductor Sci. Technol., 2005, pp. 938-946, vol. 20.

Japanese Office Action issued in Japanese Application No. 2012-095185, dated Feb. 1, 2016 (English Translation Only).

Search Report from corresponding Japanese application, dated Nov. 19, 2015.

\* cited by examiner

POLYCRYSTALLINE TEXTURING COMPOSITION AND METHOD

This application claims the benefit of priority under 35 U.S.C. §119(e) to U.S. Provisional Application No. 61/477,933, filed Apr. 21, 2011, the entire contents of which application are incorporated herein by reference.

The present invention is directed to an improved acidic polycrystalline semiconductor texturing composition and method. More specifically, the present invention is directed to an improved acidic polycrystalline semiconductor texturing composition and method which provides an isotropic etch and reduces incident light reflectance.

Polycrystalline semiconductor wafers are typically made of silicon or other similar ceramic material and have a grain size which varies from a few thousand angstroms to 2-3 μm. Such wafers may be used in the manufacture of photovoltaic devices, such as solar cells. A solar cell is a device that converts light energy incident on its surface such as sunlight into electric energy. Polycrystalline silicon semiconductor wafers are manufactured by chemical vapor deposition processes where silane is decomposed at elevated temperatures onto a substrate surface to form ingots or similar type articles. The ingots are cut into wafers of varying sizes and shapes using appropriate cutting saws and methods conventional in the industry. Saw damage to the surfaces of the wafers may increase reflectance of the wafers by as much as 35% and greater. The high reflectance decreases the incident light absorbing ability of the wafers and compromises the performance of solar cells in which the wafers are used. Various approaches have been attempted to increase the absorbance of light by reducing reflectance of light incident on the surface of solar cells. Reducing reflectance of incident light improves the efficiency of converting light into electric energy. Typically texturing is done to the surfaces of the semiconductor wafers to reduce incident light reflectance.

Texturing is often done with alkaline materials such as sodium and potassium hydroxide; however, such alkaline texturing materials behave too anisotropically to be effective polycrystalline wafer texturizers. In addition the alkali metal hydroxides tend to leave undesirable crusts or residues on the wafers which may be difficult to remove. Although tetramethylammonium hydroxide etches less anisotropically than the alkali metal hydroxides, it still exposes grain boundaries too readily. Some crystalline orientations etch faster than others in an anisotropic etch and grain boundaries are exposed which become sites for recombination and lower solar cell efficiency. In general recombination is a process by which mobile electrons and electron holes are eliminated and energy is lost in forms which cannot be utilized by the solar cell.

Another problem caused by exposure of grain boundaries is reduced shunt resistance, $R_{SH}$. Low shunt resistance causes power losses in solar cells by providing an alternate current path for light generated current. Such a diversion reduces the amount of current flowing through the solar cell junction and reduces voltage from the solar cell. The effect of shunt resistance is particularly severe at low light levels, since there is less light-generated current. The loss of this current to the shunt therefore has a severe impact on cell performance.

Although acid etches such as mixtures of hydrofluoric acid and nitric acid provide an acceptable isotropic etch for silicon polycrystalline semiconductor wafers, they present a number of problems. Such materials are hazardous and require extreme care in handling, storage, use and disposal. Significant expense may be required in disposing of such chemicals depending on local and regional treatment requirements. To texturize polycrystalline wafers with the mixture of hydrofluoric acid and nitric acid, involves dilution of concentrated 49% hydrofluoric acid and 69% nitric acid to make a bath that contains 10% hydrofluoric acid and 35% nitric acid. This is an exothermic reaction which may present hazards to workers handling the acids. In addition a running bath of the acid mixture involves replenishing large amounts of the acids and producing large amounts of acid waste which results in significant costs to the industry and presents waste hazards to the environment. In general polycrystalline silicon semiconductor wafers treated with hydrofluoric acid and nitric acid mixtures with an average reflectance of 27% at light wavelengths of 400 nm to 1100 nm is presently acceptable to the industry; however, the lower the reflectance the more efficient the solar cell. The present industry goal is a reflectance of 20% and less at light wavelengths of 400 nm to 1100 nm. Accordingly, there is a need for an improved isotropic texturing composition and method to improve solar cell performance.

In one aspect a composition includes one or more alkaline compounds, one or more sources of fluoride ions, one or more sources of oxidizing agents and a pH of less than 7.

In another aspect a method includes providing a polycrystalline semiconductor wafer; and contacting the polycrystalline semiconductor wafer with a composition including one or more alkaline compounds, one or more sources of fluoride ions, one or more sources of oxidizing agents and a pH of less than 7 to isotropically etch the polycrystalline semiconductor wafer.

The acidic composition and method isotropically texture polycrystalline semiconductor wafers without substantially exposing grain boundaries, thus recombination and shunting are reduced or prevented. Incident light reflectance is also reduced in comparison to many conventional acidic as well as alkaline texturing compositions and methods. Also adhesion of metal deposited on the surface of the wafer is improved. Accordingly, polycrystalline semiconductor wafers textured with the composition and method improves solar cell efficiency and performance. In addition handling, using and storing the acidic composition do not present hazards to workers or the environment to the same degree as conventional hydrofluoric and nitric acid isotropic texturing solutions. Further, the cost to the industry for preparing, maintaining and waste treatment is less than that of conventional hydrofluoric and nitric acid texturing solutions.

Figure 1:
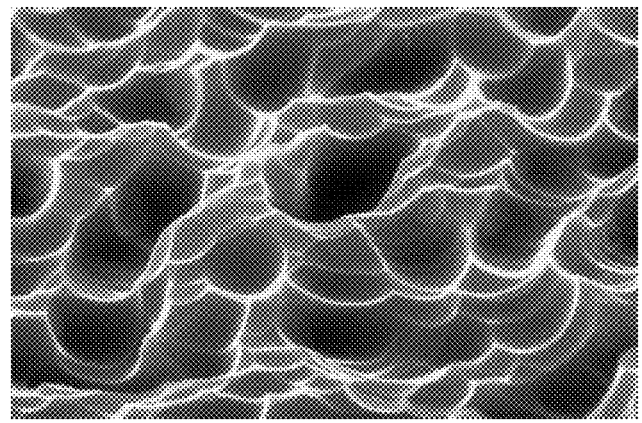
FIG. 1 is a 5000×SEM of a silicon polycrystalline bulk-doped semiconductor wafer textured with a mixture of 10% hydrofluoric acid and 50% nitric acid.

As used throughout this specification, the term "composition" and "solution" are used interchangeably. The term "isotropic" means invariant with respect to direction. The term "anisotropic" means properties which vary in direction. As used throughout this specification, the following abbreviations have the following meaning, unless the context indicates otherwise: ° C.=degrees Centigrade; A=amperes; dm=decimeter; μm=microns; nm=nanometers; SEM=scanning electron micrograph; UV=ultraviolet; and IR=infrared. All percentages and ratios are by weight unless otherwise indicated. All numerical ranges are inclusive and combinable in any order, except where it is logical that such numerical ranges are construed to add up to 100%.

Compositions include one or more derivates of ammonia, one or more sources of fluoride ions, one or more sources of oxidizing agents and a pH of less than 7. The compositions are aqueous acidic solutions. The compositions are substantially free of alkali metal hydroxides. The acidic compositions isotropically texture polycrystalline semiconductor wafers without substantially exposing grain boundaries, thus recombination and shunting are reduced or prevented. Incident light reflectance is also reduced in comparison to many conventional acidic as well as alkaline texturing compositions and methods. On the average light reflectance is 22% and less at light wavelengths of 400 nm to 1100 nm. Also adhesion of metal to the surface of the wafer is improved. Accordingly, polycrystalline semiconductor wafers textured with the composition and method improves solar cell efficiency and performance. In addition handling, using and storing the acidic composition do not present hazards to workers or the environment to the same degree as conventional hydrofluoric and nitric acid isotropic texturing solutions. Further, the cost to the industry for preparing, maintaining and waste treatment is less than that of conventional hydrofluoric and nitric acid texturing solutions.

One or more alkaline compounds which isotropically texture polycrystalline semiconductor wafers are included in the texturing compositions. Such alkaline compounds include, but are not limited to amines such as alkanolamines and quaternary ammonium compounds. Such compounds are included in the compositions in amounts of 1% to 20% or such as from 1% to 10% or such as 1% to 5% of the texturing composition Alkanolamines include, but are not limited to, compounds having a general formula:

$$R_{3-n}N(C_mH_{2m}(OH))_n$$

wherein R is a hydrogen atom or an alkyl group having 1 to 4 carbons, m is an integer of 2 to 4 and n is an integer of 1 to 3. Examples of such compounds are monoethanolamine, diethanolamine, triethanolamine, propanolamine, dipropanolamine, tripropanolamine, isopropanolamine, diisopropanolamine, triisoproanolamine, butanolamine, N-methylethanolamine, N-methyldiethanolamine, N,N-dimethylaminoethanol, N-ethylethanolamine, N-ethyldiethanolamine, N,N-diethanolamine, N,N-butylethanolamine, N,N-dibutylethanolamine and salts thereof. Preferred alkanolamines are monoethanolamine, diethanolamine and triethanolamine.

Quaternary ammonium compounds include, but are not limited to, compounds having the following general formula:

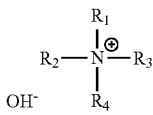

wherein $R_1$ to $R_4$ are independently hydrogen, $(C_1-C_6)$alkyl group, $(C_1-C_6)$hydroxyalkyl group, $(C_6-C_{10})$aryl group or $(C_7-C_{11})$alkylaryl group. Examples of such compounds are ammonium hydroxide, tetramethyl ammonium hydroxide (TMAH), tetraethyl ammonium hydroxide, tetrapropyl ammonium hydroxide, tetrabutyl ammonium hydroxide, tetramethyl-2-hydroxyethyl ammonium hydroxide (choline), trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethyethyl-2-hydroxyethyl ammonium hydroxide, dimethyldi(2-hydroxyethyl ammonium hydroxide, monomethyltri(2-hydroxyethyl) ammonium hydroxide, monomethyltriethyl ammonium hydroxide, monomethyltripropyl ammonium hydroxide, monomethyltributyl ammonium hydroxide, monoethyltrimethyl ammonium hydroxide, monoethyltributyl ammonium hydroxide, dimethyldiethyl ammonium hydroxide, dimethyldibutyl ammonium hydroxide, benzyl trimethylammonium hydroxide, benzyl triethylammonium hydroxide, benzyl tributylammonium hydroxide, phenyl trimethylammonium hydroxide and phenyl triethylammonium hydroxide. Preferably the quaternary ammonium compound is chosen from ammonium hydroxide, tetramethylammoium hydroxide, teramethyl-2-hydroxyethyl ammonium hydroxide and benzyl trimethylammonium hydroxide.

One or more sources of fluoride ions are included in the compositions. The fluoride ion sources texture isotropically and provide an acid environment. Fluoride ion sources include, but are not limited to, bifluorides and fluoride salts. Bifluorides include, but are not limited to, alkali metal bifluorides such as sodium bifluoride and potassium bifluoride, ammonium bifluoride, tin bifluoride and antimony bifluoride. Fluoride salts include, but are not limited to, alkali metal fluorides, such as sodium and potassium fluoride. Preferably, bifluoride compounds are included in the compositions. Sources of fluoride ions are included in amounts of 1% to 40% or such as from 5% to15%.

One or more oxidizing agents are included in the compositions. Such oxidizing agents include, but are not limited to, hydrogen peroxide and salts thereof, hypochlorite, persulfates, peroxyorganic acids, permanganate salts, sodium hypochlorite, sodium percarbonate, chlorate, nitric acid and salts thereof, periodate, perbromate, iodate, perchlorate and bromate. Such oxidizing agents are included in amounts of 0.05% to 5% or such as from 0.5% to 1%.

Optionally, the aqueous acidic compositions may include one or more surfactants. Surfactants include nonionic, anionic, cationic and amphoteric surfactants. Conventional surfactants may be used. Such surfactants are generally commercially available. Typically the surfactants are low foam surfactants. When surfactants are included in the compositions, they are included in amounts of 0.5% to 10%.

The components included in the aqueous acidic texturing compositions may be added in any order. They may be mixed together and then solubilized in a sufficient amount of water. Alternatively, they may be added to a sufficient amount of water one at a time. If needed heating may be employed to assist in solubilizing a component.

The aqueous acidic texturing compositions have a pH of less than 7, or such as less than 6 or such as from 3 to 5 or such as from 4 to 5. Typically texturing is done on both sides of the wafer. Typically the wafers are bulk-doped prior to texturing. Bulk-doping is typically done with boron but the polycrystalline wafers may be bulk-doped with other materials well known in the art. The acidic texturing compositions may be applied to the polycrystalline semiconductor wafer by any suitable method known in the art. The polycrystalline semiconductor wafer may be immersed in the texturing composition, the composition may be sprayed on the polycrystalline semiconductor wafer or the composition may be used in conventional ultrasonic cleaning processes. The texturing compositions may be applied at temperature ranges from room temperature to 90° C., typically from 50°

C. to 80° C. The texturing composition is applied to a surface of the polycrystalline semiconductor wafer for dwell times of 5 minutes to 40 minutes, typically from 10 minutes to 30 minutes. The polycrystalline semiconductor wafer is then optionally rinsed with water. After the polycrystalline semiconductor wafer is textured, it is processed using conventional methods in the manufacture of photovoltaic devices, such as solar cells.

Reflectance of incident light by the textured polycrystalline semiconductor wafers is 22% and less, typically 20% and less, more typically 15% to 20% at incident light wavelengths of 400 nm to 1100 nm. The polycrystalline semiconductors textured with the acidic aqueous compositions may be used in devices which convert incident light, such as light from sunlight, lasers, fluorescent light, as well as other sources of light, into electric energy. Such devices include, but are not limited to photovoltaic devices, such as solar cells, optical and electrochemical detectors/sensors, biodetectors/biosensors, catalysts, electrodes, gate electrodes, ohmic contacts, interconnection lines, Schottky barrier diode contacts and optoelectronic components.

After the polycrystalline semiconductor wafer is textured, if bulk-doped, it is further doped to provide a PN junction. If the polycrystalline wafer is not bulk-doped, it is bulk-doped or p-doped, such as with boron, then further doped to provide a PN junction. To produce the semiconductor PN junction phosphorus diffusion or ion implantation takes place on the front side of the wafer to produce an n-doped (n+ or n++) region. The n-doped region may be referred to as the emitter layer.

In the manufacture of a photovoltaic device or solar cell, the entire back side of the polycrystalline semiconductor wafer may be metal coated or a portion of the back side may be metal coated, such as to form a grid. Such back side metallization may be provided by a variety of techniques, and may be done prior to the metallization of the front side of the wafer. In one embodiment, a metal coating is applied to the back side in the form of an electrically conductive paste, such as a silver-containing paste, an aluminum-containing paste or a silver and aluminum-containing paste; however, other suitable pastes known in the art also may be used. Such conductive pastes typically include conductive particles embedded in a glass matrix and an organic binder. Conductive pastes may be applied to the wafer by a variety of techniques, such as screen printing. After the paste is applied, it is fired to remove the organic binder. When a conductive paste containing aluminum is used, the aluminum partially diffuses into the back side of the wafer, or if used in paste form also containing silver, may alloy with the silver. Optionally, a seed layer may be deposited on the back side of the polycrystalline semiconductor wafer and a metal coating may be deposited on the seed layer by electroless or electrolytic plating.

An anti-reflective layer is added to the front side or emitter layer of the wafer. In addition the anti-reflective layer may serve as a passivation layer. Suitable anti-reflective layers include, without limitation, silicon oxide layers such as $SiO_x$, silicon nitride layers such as $Si_3N_4$, a combination of silicon oxide and silicon nitride layers, and combinations of a silicon oxide layer, a silicon nitride layer with a titanium oxide layer such as $TiO_x$. In the foregoing formulae, x is an integer representing the number of oxygen atoms. Such anti-reflective layers may be deposited by a number of techniques, such as by various vapor deposition methods, for example, chemical vapor deposition and physical vapor deposition.

The front side of a polycrystalline semiconductor wafer contains a metallized pattern. For example, the front side of a wafer may be composed of current collecting lines and current busbars. Current collecting lines are typically transverse to the busbars and typically have a relatively fine-structure (i.e. dimensions) relative to current busbars.

The pattern reaches through the antireflective layer to expose the surface of the semiconductor body of the wafer. Alternatively trenches may be formed in the openings to create a selective emitter. These trenches may be regions of high doping. A variety of processes may be used to form the pattern, such as, but not limited to, laser ablation, mechanical means, and lithographic processes, all of which are well known in the art. Such mechanical means include sawing and scratching. Typical photolithographic processes include disposing an imageable material on the surface of the wafer, patterning the imageable material to form openings in the anti-reflective layer, transferring the pattern to the wafer, depositing a nickel layer in the openings and removing the imageable material. In one embodiment, the imageable material is removed before the step of depositing a metal layer in the openings. In another embodiment, the imageable material is removed after the step of depositing a metal layer in the openings. When the imageable material is present during the metal deposition step, such imageable material typically avoids any dyes, such as contrast dyes, that absorb in the wavelength of radiation used during the nickel deposition step. Imageable material present during the plating step typically contains a dye which has a minimum light transmittance of 40% to 60%.

The imageable material may be removed using any suitable polymer remover. Such removers may be alkaline, acidic or essentially neutral and are well known in the art.

The front side of the wafer may be metallized using a conductive paste, which may be the same as or different from any conductive paste used on the rear side of the wafer. Any conductive paste used to metallize the front side of a wafer typically does not contain aluminum. The temperature used in the firing of the paste depends on the particular paste used, the thickness of any antireflective layer used, among other factors. The choice of such temperature is well within the ability of those skilled in the art. Also, it is appreciated by those skilled in the art that the firing process may be performed in an oxygen-containing atmosphere, an inert atmosphere, a reducing atmosphere, or a combination of any of these. For example, the firing may be performed at a first temperature in an atmosphere containing little oxygen and then at a second temperature under an inert atmosphere or under a reducing atmosphere, where the second temperature is higher than the first temperature.

Following the firing process, the wafer may optionally be contacted with a buffered acid solution, such as a buffered hydrofluoric acid solution, to remove any oxide produced during the firing procedure. Such contact may be by spraying the solution on the wafer or by dipping the wafer into such solution or by any other suitable means.

After the front side pattern and rear side of the wafer are metallized using conductive paste, a layer of metal is then deposited on the front side conductive pattern. Such layer of metal may be any suitably conductive metal such as gold, silver or copper, and is typically silver. Such metals may be deposited by methods known in the art. In one embodiment, the deposited metal layer is composed of the same metal used in the conductive paste. For example, a silver layer is deposited on a silver-containing conductive paste.

Silver may deposited by light induced plating (LIP) or conventional silver electroplating methods well known in the art. When LIP is used, the rear side of the semiconductor wafer is connected to a source of external current (rectifier). A silver anode placed in the silver plating composition is connected to the rectifier such that a completed circuit is formed between the components. Typical current densities are from 0.1 A/dm$^2$ to 5 A/dm$^2$. The total current requirement is dependent upon the particular size of the wafer used. Additionally, the silver anode provides a ready source of silver ions to replenish the silver plating composition with silver ions without the need to use an external source. A light source is positioned to illuminate the semiconductor wafer with light energy. The light source can be, for example, a fluorescent or LED lamp which provides energy within the wavelengths to which the semiconductor wafer is photovoltaically sensitive. A variety of other light sources may be used, such as, but not limited to, incandescent lamps such as a 75 watt and 250 watt lamps, mercury lamps, halogen lamps and a 150 watt IR lamp. Examples of commercially useful silver plating compositions are available as ENLIGHT™ Silver Plate 600 and 620 from Rohm and Haas Electronic Materials, LLC Marlborough, Mass.

The plating cell is of such a material as to be chemically inert with respect to the silver plating composition and has a minimum light transmittance of 40-60%. Alternatively, the wafer can be positioned horizontally in the plating cell and illuminated from above the silver plating composition, in which case the plating cell need not have at least the minimum light transmittance.

In another embodiment a metal seed layer may be deposited on the front side conductive pattern instead of a metal paste. Typically the metal seed layer is nickel. The nickel seed layer may be deposited by any conventional nickel deposition method known in the art. Typically, the nickel seed layer is deposited by light assisted nickel deposition. If the source of the nickel is an electroless nickel composition, plating is done without application of external current. If the source of the nickel is from an electrolytic nickel composition, a rear side potential (rectifier) is applied to the semiconductor wafer substrate. The light may be continuous or pulsed. Prior to depositing nickel, surface oxides are typically removed from the conductive pattern using a solution of 1% hydrofluoric acid.

Light which may be used in the plating process includes, but is not limited to, visible light, IR, UV and X-rays. Light sources include, but are not limited to, incandescent lamps, LED lights (light emitting diodes), infrared lamps, fluorescent lamps, halogen lamps and lasers.

Typically, nickel is deposited through the openings in the anti-reflective layer and onto the exposed textured surface of the polycrystalline semiconductor wafer using an electroless nickel plating composition. Examples of commercially available electroless nickel compositions include DURAPOSIT™ SMT 88 Electroless Nickel and NIPOSIT™ PM 980 and PM 988 Electroless Nickel. All are available from Rohm and Haas Electronic Materials, LLC, Marlborough, Mass., U.S.A.

Alternatively, electrolytic nickel compositions may be used. When an electrolytic composition is used, an applied rear side potential (rectifier) is used in addition to light to deposit the nickel. Typical current densities are from 0.1 A/dm$^2$ to 2 A/dm$^2$. The particular current requirement is dependent upon the particular size of the wafer used. The electroplating processes used are conventional. Suitable electrolytic nickel plating baths are commercially available as well as many which are disclosed in the literature. Examples of commercially available electrolytic nickel baths are the NICKEL GLEAM™ Electrolytic Nickel products obtainable from Rohm and Haas Electronic Materials, LLC.

By illuminating the front of the polycrystalline semiconductor wafer with light energy, plating occurs on the front. The impinging light energy generates a current in the semiconductor. The rate of plating on the front is controllable by adjusting the light intensity, bath temperature, reducing agent activity, starting wafer conditions, doping level as well as other parameters which are known to workers in the art. If the plating bath is an electrolytic bath the rate of plating may also be adjusted by the rectifier. A nickel layer of 20 nm to 300 nm thickness is typically desired, with the exact thickness depending on various factors such as on the application, size, pattern and geometry.

After the nickel is deposited through the openings and adjacent to the exposed surface of the polycrystalline semiconductor wafer substrate, silver is then deposited adjacent to the nickel. Conventional electroplating silver compositions may be used. The silver compositions may be cyanide containing silver compositions or cyanide-free silver compositions.

Silver may be deposited on the nickel by light induced plating (LIP) or conventional silver electroplating methods well known in the art. The procedure of LIP plating is similar to that for plating the silver paste described above. A silver layer of 1 µm to 30 µm thickness is typically desired, with the exact thickness depending on various factors such as on the application, size, pattern and geometry.

After the silver metal is deposited onto and adjacent the nickel, the semiconductor is then sintered to form nickel silicide. Sintering is done with the silver deposited onto the nickel surface to improve adhesion between the silver and nickel. The improved bonding between the nickel and the silicon reduces the probability of adhesion failure between the nickel silicide and the silver. Further, silver is not incorporated into the silicide by the sintering temperatures, thus nickel silicide is formed with the silver protecting the nickel from oxidation during sintering. A furnace providing a wafer peak temperature of 380° C. to 550° C. may be used. Typically, peak temperature times range from 2 seconds to 20 seconds. An example of a suitable furnace is a lamp based furnace (IR).

Since the silver layer protects the nickel from oxidation during sintering, sintering may be done in oxygen containing environments as well as inert gas atmosphere or vacuum. In general, sintering is done for 3 minutes to 10 minutes Line speeds at which the semiconductor passes through the furnace may vary depending on the furnace used. Minor experimentation may be done to determine the appropriate line speed. Typically, the line speed is from 330 cm/minute to 430 cm/minute.

After the polycrystalline semiconductor wafer is metallized additional conventional steps may be performed on the metallized semiconductor to complete the formation of the photovoltaic device. Such methods are well known in the art.

The following Examples are intended to further illustrate the invention but are not intended to limit the scope of the invention.

EXAMPLE 1

An aqueous isotropic texturing solution was made up containing 10% hydrofluoric acid and 50% nitric acid. The pH of the acid mixture texturing solution was less than 1. A bulk-doped polycrystalline silicon wafer 125 mm² was weighed using a conventional analytical balance and its weight was recorded. The wafer was then immersed into the aqueous isotropic texturing solution for 3 minutes at 10° C. The wafer was then removed from the solution and rinsed with deionized water for one minutes and dried at room temperature. The wafer was weighed. The amount of etching on both sides of the wafer was calculated to be 4.5 μm using a conventional method from the weight loss during texturing, area of the wafer and density of silicon. FIG. 1 is a 5000×SEM of the surface of the textured wafer. There were no observable exposed grain boundaries.

The reflectance of the wafer was then measured using a MacBeth ColorEye™ Reflectometer. Reflectance was recorded in 10nm increments from an incident light wavelength range of 1100 nm down to 400 nm. The average % reflectance was then calculated by the reflectometer for the range. The average incident light reflectance was determined to be 25.44% which was above the preferred reflectance of 20% and less.

EXAMPLE 2

The following isotropic acidic aqueous texturing solution was prepared.

TABLE 1

| COMPONENT | AMOUNT - Weight % |
|---|---|
| Tetramethylammonium hydroxide | 7.5% |
| Hydrogen peroxide | 1% |
| Ammonium bifluoride | 15% |
| Water | Balance |

Figure 2:
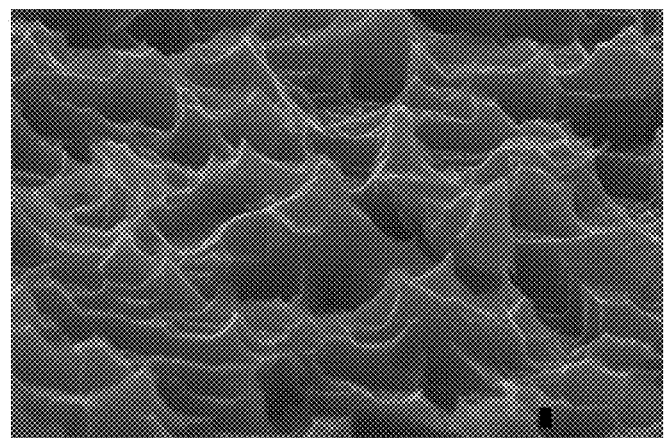
FIG. 2 is a 5000×SEM of a silicon polycrystalline bulk-doped semiconductor wafer textured with a mixture of 7.5% TMAH, 1% hydrogen peroxide and 15% ammonium bifluoride.

A bulk-doped polycrystalline silicon wafer was weighed and its weight was recorded. It was then immersed into the solution for 10 minutes at 80° C. The pH of the solution was 4. The wafer was then removed from the solution and rinsed with deionized water and air dried. The wafer was then weighed and the amount of silicon etched from each side of the wafer was determined to be 4.73 μm. FIG. 2 shows a surface of the textured wafer. There were no observable exposed grain boundaries.

The reflectance of the wafer was then measured using a MacBeth ColorEye™ Reflectometer. Reflectance was recorded in 10 nm increments at a wavelength range of 1100 nm down to 400 nm. The average % reflectance was then calculated by the reflectometer for the range. The average incident light reflectance was determined to be 15.37%. Texturing with the composition disclosed in Table 1 above provided a polycrystalline wafer which showed reduced incident light reflectance in contrast to that of the acid mixture formulation of Example 1.

EXAMPLE 3

The following isotropic acidic aqueous texturing solution was prepared.

TABLE 2

| COMPONENT | AMOUNT - Weight % |
|---|---|
| Tetramethylammonium hydroxide | 5.25% |
| Hydrogen peroxide | 0.7% |
| Ammonium bifluoride | 10.25% |
| Water | Balance |

A bulk-doped polycrystalline silicon wafer was weighed and its weight was recorded. It was then immersed into the solution for 12 minutes at 85° C. The pH of the solution was 4. The wafer was then removed from the solution and rinsed with deionized water and air dried. The wafer was then weighed and the amount of silicon etched from each side of the wafer was determined to be 4.42 μm. The surface of the etched silicon wafer had a similar appearance as that of FIG. 2. Also, there were no observable exposed grain boundaries.

The reflectance of the wafer was then measured using a MacBeth ColorEye™ Reflectometer. Reflectance was recorded in 10 nm increments at a wavelength range of 1100 nm down to 400 nm. The average % reflectance was then calculated by the reflectometer for the range. The average incident light reflectance was determined to be 17.68%. Texturing with the composition disclosed in Table 2 above provided a polycrystalline wafer which showed reduced incident light reflectance in contrast to that of the acid mixture formulation of Example 1.

EXAMPLE 4

The following isotropic acidic aqueous texturing solution was prepared.

TABLE 3

| COMPONENT | AMOUNT - Weight % |
|---|---|
| Ammonium hydroxide | 2.89% |
| Hydrogen peroxide | 1% |
| Ammonium bifluoride | 15% |
| Water | Balance |

A bulk-doped polycrystalline silicon wafer was weighed and its weight was recorded. It was then immersed into the solution for 10 minutes at 80° C. The pH of the solution was 4. The wafer was then removed from the solution and rinsed with deionized water and air dried. The wafer was then weighed and the amount of silicon etched from each side of the wafer was determined to be 4.26 μm. The surface of the etched silicon wafer had a similar appearance as that of FIG. 2. Also, there were no observable exposed grain boundaries.

The reflectance of the wafer was then measured using a MacBeth ColorEye™ Reflectometer. Reflectance was recorded in 10 nm increments at a wavelength range of 1100 nm down to 400 nm. The average % reflectance was then calculated by the reflectometer for the range. The average incident light reflectance was determined to be 18.11%. Texturing with the composition disclosed in Table 3 above provided a polycrystalline wafer which showed reduced incident light reflectance in contrast to that of the acid mixture formulation of Example 1.

EXAMPLE 5

The following isotropic acidic aqueous texturing solution was prepared.

TABLE 4

| COMPONENT | AMOUNT - Weight % |
|---|---|
| Monoethanolamine | 10% |
| Hydrogen peroxide | 1% |
| Ammonium bifluoride | 20% |
| Water | Balance |

A bulk-doped polycrystalline silicon wafer was weighed and its weight was recorded. It was then immersed into the solution for 10 minutes at 60° C. The pH of the solution was 4. The wafer was then removed from the solution and rinsed with deionized water and air dried. The wafer was then weighed and the amount of silicon etched from each side of the wafer was determined to be 2.61 μm. The surface of the etched silicon wafer had a similar appearance as that of FIG. 2. There were no observable exposed grain boundaries.

The reflectance of the wafer was then measured using a MacBeth ColorEye™ Reflectometer. Reflectance was recorded in 10 nm increments from 1100 nm down to 400 nm The average % reflectance was then calculated by the reflectometer for the range. The average incident light reflectance was determined to be 19.82%. Texturing with the composition disclosed in Table 4 above provided a polycrystalline wafer which showed reduced incident light reflectance in contrast to that of the acid mixture formulation of Example 1.

EXAMPLE 6

Figure 3:
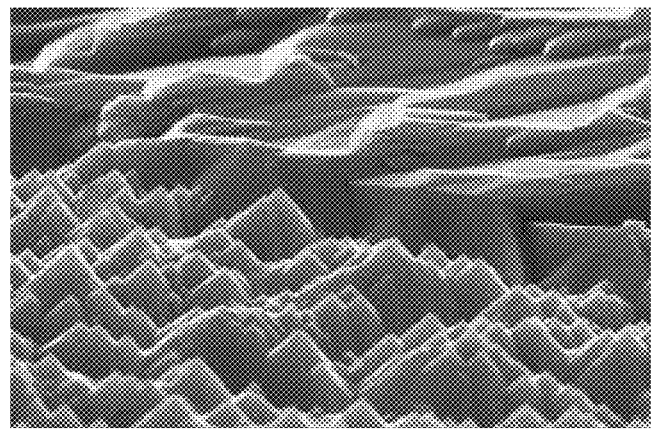
FIG. 3 is a 2500×SEM of a silicon polycrystalline bulk-doped semiconductor wafer textured with a 9% TMAH aqueous solution.

An aqueous alkaline anisotropic texturing solution was made up composed of 9% tetramethylammonium hydroxide. The pH of the texturing solution was greater than 13. A bulk-doped polycrystalline silicon wafer was weighed using a conventional analytical balance and its weight was recorded. The wafer was then immersed into the aqueous anisotropic texturing solution for 5 minutes at 70° C. The wafer was then removed from the solution and rinsed with deionized water for one minute and dried at room temperature. The wafer was weighed. The amount of etching on both sides of the wafer was calculated to be 4.38 μm. FIG. 3 is a 2500×SEM of the surface of the textured wafer. The foreground of the SEM shows pyramid structures formed by the alkaline TMAH texturing. The area behind the pyramid structures shows the undesirable exposed grain boundaries caused by the TMAH alkaline solution. Such grain boundaries were not observed in the isotropic texturing of Examples 1-5.

The reflectance of the wafer was then measured using a MacBeth ColorEye™ Reflectometer. Reflectance was recorded in 1 nm increments from 1100 nm down to 400 nm The average % reflectance was then calculated by the reflectometer for the range. The average incident light reflectance was determined to be 27.10% which was much higher than the average incident light reflectance of isotropic texturing solutions of Examples 1-5, in particular, Examples 2-5 which had average incident light reflectance values below 20%.

What is claimed is:

1. A semiconductor texturing composition comprising one or more alkaline compounds, one or more sources of fluoride ions, one or more sources of oxidizing agents and a pH of 3-5, and
    wherein the composition is free of alkali metal hydroxides.

2. The composition of claim 1, wherein the one or more alkaline compounds are chosen from alkanolamines and quaternary ammonium compounds.

3. The composition of claim 2, wherein the alkanolamines have a general formula:

wherein R is a hydrogen atom or an alkyl group having 1 to 4 carbons, m is an integer of 2 to 4 and n is an integer of 1 to 3.

4. The composition of claim 2, wherein the quaternary ammonium compounds have a
    general formula:

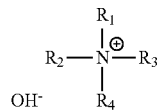

wherein $R_1$ to $R_4$ are independently hydrogen, $(C_1\text{-}C_6)$alkyl group, $(C_1\text{-}C_6)$hydroxyalkyl group, $(C_6\text{-}C_{10})$aryl group or $(C_7\text{-}C_{11})$alkylaryl group.

5. The composition of claim 1, wherein the one or more fluoride ions are chosen from bifluorides and fluoride salts.

6. The composition of claim 1, wherein the one or more oxidizing agents are chosen from hydrogen peroxide and salts thereof, hypochlorite, persulfates, peroxyorganic acids, permanganate salts, sodium hypochlorite, sodium percarbonate, chlorate, nitric acid and salts thereof, periodate, perbromate, iodate, perchlorate and bromated.

7. The composition of claim 5, wherein the bifluorides are chosen from alkali metal bifluorides, ammonium bifluoride, tin bifluoride and antimony bifluoride.

8. The composition of claim 7, wherein the bifluorides are in amounts of 1% to 40%.

9. The compositon of claim 8, wherein the bifluorides are in amounts of 5% to 15%.

* * * * *